United States Patent [19]

Schroder

[11] 4,365,259

[45] Dec. 21, 1982

[54] RADIANT ENERGY SENSOR WITH REDUCED OPTICAL REFLECTION AND BLOOMING

[75] Inventor: Dieter K. Schroder, Pittsburgh, Pa.

[73] Assignee: Westinghouse Electric Corp., Pittsburgh, Pa.

[21] Appl. No.: 202,050

[22] Filed: Oct. 30, 1980

Related U.S. Application Data

[63] Continuation of Ser. No. 962,833, Nov. 21, 1978, abandoned.

[51] Int. Cl.³ .......................................... H01L 27/14
[52] U.S. Cl. ........................................ 357/30; 357/31
[58] Field of Search .................................. 357/30, 31

[56] References Cited

U.S. PATENT DOCUMENTS 3,812,518  3/1974  Kurz ..................................... 357/30
4,321,614  3/1982  Bluzer et al. ......................... 357/30

Primary Examiner—Martin H. Edlow
Attorney, Agent, or Firm—R. M. Trepp

[57] ABSTRACT

A radiant energy sensor is described incorporating a crystalline substrate having a surface suitable for receiving radiant energy and a plurality of detectors for converting radiant energy into electrical signals wherein optical reflections and blooming between detectors is reduced by optical absorption of the radiant energy in heavily doped layers positioned at or beyond the ends of the detectors.

16 Claims, 9 Drawing Figures

RADIANT ENERGY SENSOR WITH REDUCED OPTICAL REFLECTION AND BLOOMING

This is a continuation of application Ser. No. 962,833, filed Nov. 21, 1978 now abandoned.

BACKGROUND OF THE INVENTION

1. Field of the Invention

This invention relates to radiant energy sensors, and more particularly to an improved radiant energy sensor employing heavily doped layers within a crystalline substrate to reduce optical reflections and blooming.

2. Description of the Prior Art

In the prior art, a radiant energy sensor may be formed by fabricating a plurality of detectors on a crystalline substrate. Normally, the radiant energy sensor would have the radiant energy from a field of view focused on a plurality of detectors to convert the radiant energy into electrical signals. The optics or lens system which focuses radiant energy from a field of view onto the plurality of detectors or focal plane surface causes the radiant energy to diverge as it passes beyond the focal point or focal plane into the crystalline substrate. If the radiant energy is not totally absorbed in the detector, radiant energy will pass through the detector and exit the crystalline substrate or be reflected back into the detector by the lower side of the crystal substrate. If the radiant energy will remain in the same detector, the sensitivity of the detector would increase. If however the radiant energy diverges outside its detector into an adjacent detector, then the adjacent detector sensitivity is degraded due to absorbing radiant energy not originally focused on it. For any reasonable lens f/number used in the lens system for focusing such as f/2, the radiant energy or reflected rays diverge as they propagate. The phenomenon of radiant energy passing through its intended detector and then being reflected into an adjacent detector is known as optical crosstalk.

The problem of optical crosstalk is especially acute in extrinsic silicon infrared photodetectors because they have a lower optical absorption coefficient than intrinsic silicon infrared photodetectors or visible photodetectors.

One method for reducing optical reflection is to apply an anti-reflection film on the back surface of the crystalline substrate. However, the anti-reflection film must have an index of refraction suitable for the material of the crystalline substrate over a broad wavelength range to provide broad wavelength anti-reflection performance. While anti-reflection films or quarter wave plates can be provided, their performance on a silicon substrate is not uniform, even in the wavelength range from three to five micrometers, for example.

In the prior art, the concentration of the dopants in crystalline substrates has been measured by determining the reflectivity of the doped layers such as described in an article by L. E. Howarth and J. F. Gilbert entitled "Determination of Free Electron Effective Mass of N-Type Silicon", published in Journal of Applied Physics, Vol. 34, pp. b 236–237, January 1963. The amount of radiant energy reflected by a doped layer was in part due to free carrier absorption in the doped layer.

It is desirable to reduce the optical crosstalk in certain radiant energy sensors by providing a means for absorbing the radiant energy after it passes through the predominant portion of a detector to prevent its reflection into adjacent detectors.

SUMMARY OF THE INVENTION

In accordance with the present invention, a sensor is provided for converting radiant energy into electrical signals and for suppressing optical crosstalk comprising a crystalline substrate having a first surface suitable for receiving radiant energy, the substrate including a plurality of detectors for generating electronic charge in response to the passing of radiant energy through the first surface, and means for absorbing a portion of the radiant energy passing through the first surface and propagating a predetermined distance in the crystalline substrate below the first surface.

DESCRIPTION OF THE PREFERRED EMBODIMENTS

Figure 1:
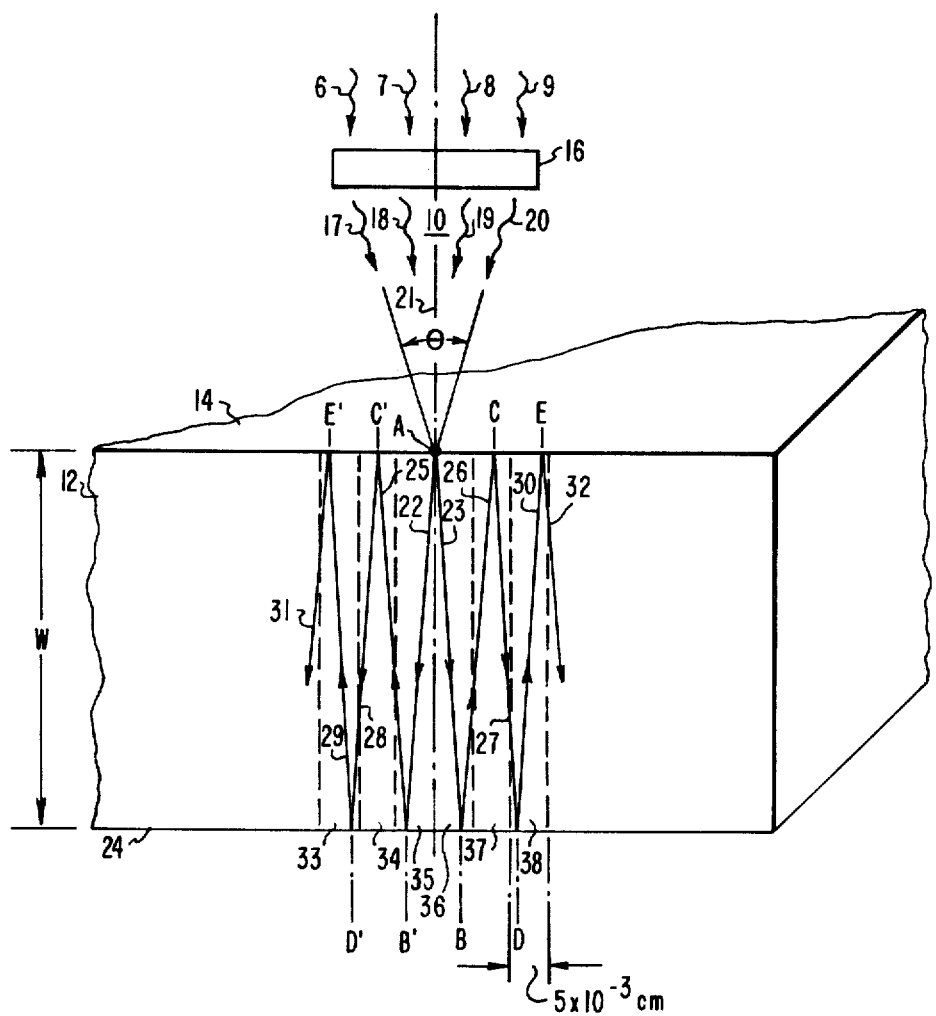
FIG. 1 shows radiant energy diverging in a crystalline substrate.

Referring to FIG. 1, radiant energy 10 is shown entering crystalline substrate 12 through upper surface 14. Radiant energy 10 may have passed through a lens system 16 which functions to focus radiant energy 10 upon upper surface 14 of crystalline substrate 12. The focused radiant energy may be represented by arrows 17 through 20. Radiant energy 10 may be, for example, radiant energy from an object in the field of view of the lens system 16. A portion of radiant energy 10 which is focused on upper surface 14 enters upper surface 14 at point A as shown in FIG. 1. Radiant energy 10 has a center axis 21 originating from lens system 16. The diameter or aperture of lens system 16 upon which light may pass through and the focal length of lens system 16 determine the angle $\theta$ from which the radiant energy subtends as it enters upper surface 14 at point A. If the center axis 21 is perpendicular to a surface 14, then the maximum angle of radiation with respect to center axis 21 is shown by radiant energy arrow 17 having an angle $\theta/2$ and radiant energy arrow 20 having an angle. $\theta/2$.

The photon flux density, $\Phi$, in photons/second centimeter squared is defined as the radiant energy impinging upon point A. Substrate 12 may be, for example, silicon and may have a reflectance R equal to 0.3. In other words, upper surface 14 of substrate 12 would reflect 0.3 of the photons impinging upon the upper surface 14 at point A. The amount of photon flux passing through upper surface 14 at point A into substrate 12 is given in Table 1.

TABLE 1

| Surface Point or Area | Equation for Remaining Photon Flux | |
|---|---|---|
| A | $(1 - R)\Phi$ | $= .7\Phi$ |
| B-B' | $(1 - R)\Phi e^{-\alpha\omega}$ | $= .42\Phi$ |
| C-C' | $(1 - R)R\Phi e^{-2\alpha\omega}$ | $= .07\Phi$ |
| D-D' | $(1 - R)R^2\Phi e^{-3\alpha\omega}$ | $= 1.4 \times 10^{-2}\Phi$ |
| E-E' | $(1 - R)R^3\Phi e^{-4\alpha\omega}$ | $= 2.5 \times 10^{-3}\Phi$ |

In Table 1, reflectance, R equals 0.3; absorption coefficient $\alpha$ equals 10 cm$^{-1}$; and path length or substrate thickness, $\omega$ equals $5 \times 10^{-2}$ cm.

The radiant energy that passes through point A diverges as it propagates into substrate 12 having outer limits of a cone, for example, defined by lines 22 and 23. The radiant energy propagates through substrate 12 intersecting lower surface 24 whereupon a portion of the incident radiant energy is reflected back towards the upper surface 14. The area incident on the lower surface, a circle for example, defined by lines 22 and 23 is designated B and B'. As the radiant energy passes through substrate 12, a portion of the energy is absorbed. The amount of radiant energy reflected at the lower surface 24 between B and B' is shown in Table 1. The beam is reflected towards the upper surface 14 having outer limits described by lines 25 and 26 and impinges upon upper surface 14 between C and C'. The beam is re-reflected towards the lower surface 24 impinging upon the lower surface between D and D' and defined by lines 27 and 28. The beam having a circular cross section for example is reflected from the lower surface 24 towards the upper surface 14 and impinges upon the upper surface 14 between E and E' and is defined by the lines 29 and 30. The beam is reflected by the upper surface 14 towards the lower surface 24 having its outer width defined by lines 31 and 32. Arrows are placed on lines 22, 23, 25 through 32 to show the direction of the radiant energy beam as it passes through substrate 12. Table 1 shows the amount of radiant energy, $\Phi$, leaving lower surface 24 between points B and B' and later between points D and D'. Table 1 also shows the radiant energy leaving upper surface 14 between points C and C' and later between points E and E'. As shown in FIG. 1, crystalline substrate 12 has detectors 33 through 38 which are positioned adjacent one another and parallel for example to center axis 21. Center axis 21 lies between detectors 35 and 36. Point A is shown in FIG. 1 as located on center axis 21 on the upper surface 14.

FIG. 1 graphically shows that optical radiation entering point A diverges and spreads as it is reflected off lower surface 24 and upper surface 14 through a multiple number of passes through substrate 12 resulting in optical absorption of radiant energy in detectors 33 through 38. Each detector 33 through 38 is assumed to have a rectangular cross-section with each side being $5 \times 10^{-3}$ centimeters. For a very intense radiant energy signal such as from a rocket plume, the incident radiation may be so intense that reflected radiant energy diverges and is absorbed by detectors over an area much larger than the size of the target which may be as many as 100 detectors for a $10^5$ overload signal, above detector saturation.

Figure 2:
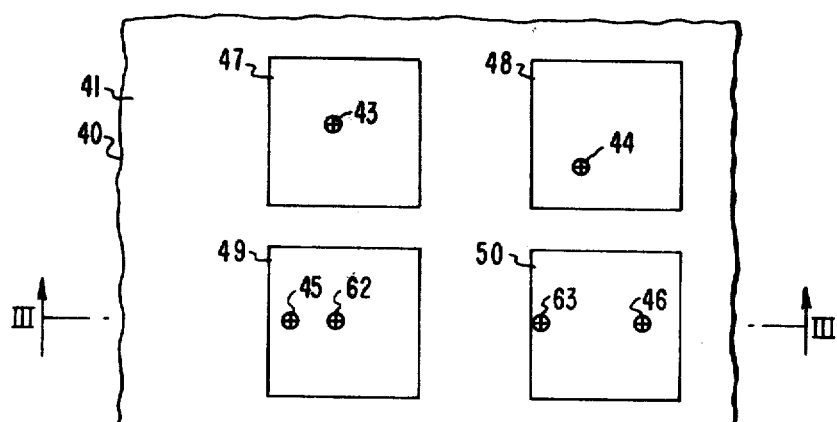
FIG. 2 shows a top view of one embodiment of the invention.
Figure 3:
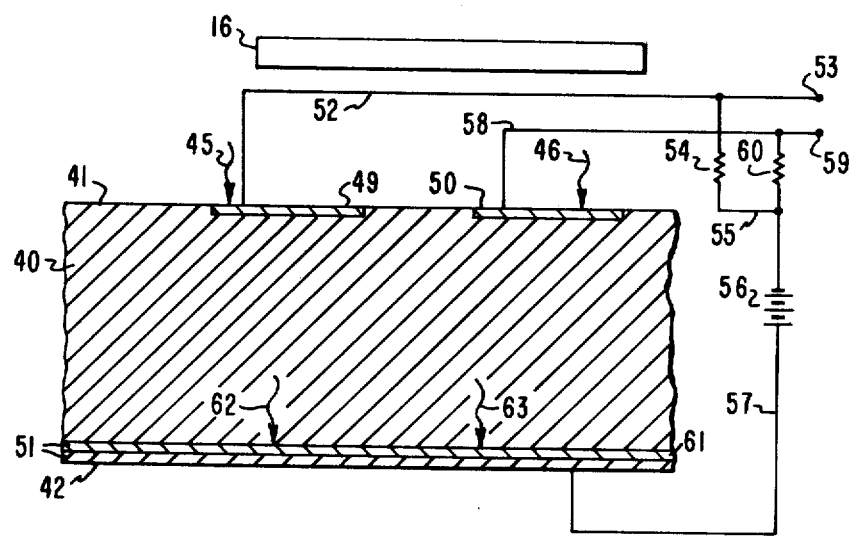
FIG. 3 shows a cross section view along the lines III—III of FIG. 2.

FIG. 2 shows a top view of one embodiment of the invention and FIG. 3 shows a cross-section view along the lines III—III of FIG. 2. In FIGS. 2 and 3, crystalline substrate 40, which may be for example silicon doped with indium to form P-type material or silicon doped with sulfur to form N-type material. Substrate 40 has an upper surface 41 and a lower surface 42. The embodiment in FIGS. 2 and 3 is a sensor for converting radiant energy into electrical signals and for suppressing optical crosstalk. Upper surface 41 is suitable for receiving radiant energy such as shown by arrows 43 through 46.

Electrodes 47 through 50 are on or below the upper surface 41 of substrate 40 and electrode 51 is in or on the lower surface 42. The electrodes 47 through 51 form a plurality of detectors for generating electronic charge in response to the passing of radiant energy through the upper surface 41. If substrate 40 is doped to form a P-type material then the upper electrodes may be formed by a P+ diffusion (boron). If substrate 40 is N type, then the electrodes 47 through 50 on the upper surface 41 may be formed by an N+ diffusion (phosphorus). It is understood that a P+ or N+ diffusion has an impurity level in excess of $10^{17}$ atoms cm$^{-3}$.

As shown in FIG. 3, the electrode 49 is coupled over line 52 to output terminal 53 and to one side of resistor 54. The other side of resistor 54 is coupled over line 55 to one side of battery 56 and one side of resistor 60. The other side of battery 56 is coupled over line 57 to electrode 51. Electrode 50 is coupled over line 58 to output terminal 59 and to the other side of resistor 60.

Electrode 51 includes means for absorbing a portion of the radiant energy passing through substrate 40 from upper surface 41. Radiant energy propagating beyond a predetermined distance below upper surface 41 passes into a means for absorbing radiant energy. The means for absorbing includes a highly doped layer of impurities to provide absorption of radiant energy by free carrier absorption. The heavily doped layer 61 may be formed by the well-known processes of diffusion, epitaxial deposition, or ion implantation. The heavily doped layer must have a high impurity concentration to provide free carriers in the layer 61 to absorb radiant energy, arrows 62 and 63 shown in FIG. 3.

Figure 4:
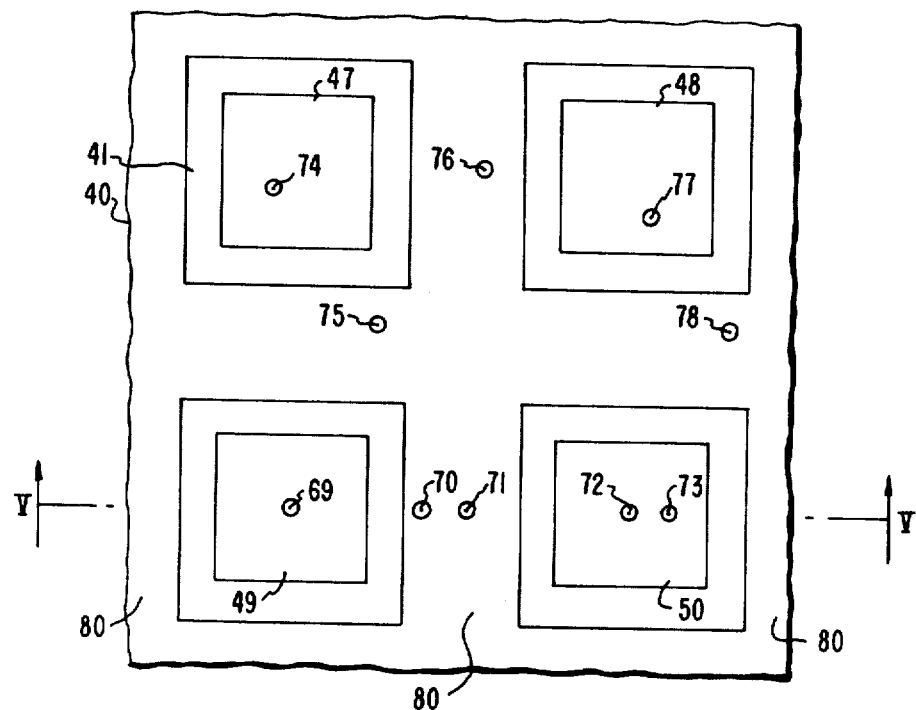
FIG. 4 shows a top view of an alternate embodiment of the invention.
Figure 5:
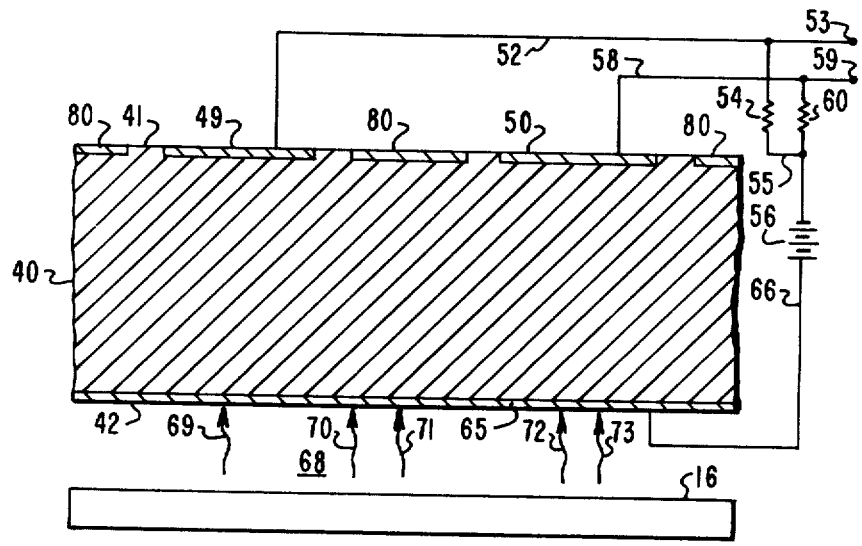
FIG. 5 shows a cross section view along the lines V—V of FIG. 4.

FIG. 4 shows a top view of a sensor for converting radiant energy into electrical signals and for suppressing optical crosstalk. FIG. 5 shows a cross-section view along the lines V—V of FIG. 4. In FIGS. 4 and 5 like references are used for functions corresponding to the apparatus of FIGS. 2 and 3. Electrode 65 is in or on lower surface 42 of substrate 40 and is coupled over line 66 to one side of battery 56 as shown in FIG. 5. Electrodes 47 through 50 in combination with electrode 65 form a plurality of detectors for generating electronic charge in response to the passing of radiant energy through substrate 40.

Lower surface 42 is suitable for receiving radiant energy 68 as shown by arrows 69 through 73 in FIG. 5. Additional radiant energy is shown in FIG. 4 entering lower surface 42 by reference numerals 74 through 78. It is understood that radiant energy 68 may come from a lens system 16 which focuses the radiant energy received from a field of view onto the lower surface 42 of substrate 40. It is understood that the radiant energy entering substrate 40 has a tendency to diverge as a function of the f/number of lens system 16 in a similar manner as shown in FIG. 1.

In order to reduce optical crosstalk due to multiple reflections of radiant energy 68 within substrate 40, a heavily doped layer of impurities 80 provides a means for absorbing a portion of the radiant energy 68 passing through lower surface 42 and propagating beyond a predetermined distance into substrate 40. Heavily doped layer 80 may be formed in a similar fashion as heavily doped layer 61 shown in FIGS. 2 and 3 and provides the same function as heavily doped layer 61 of absorbing the radiant energy incident to the heavily doped layer. In FIGS. 4 and 5, heavily doped layer 80 is electrically separate from the electrodes of the plurality of detectors and does not require connection to an electrical bias. If substrate 40 is of P-type material and electrodes 47 through 50 and 65 are of P+ type material, heavily doped layer 80 may be N+ type material having a dopant concentration in excess of $10^{17}$ atoms $cm^{-3}$.

Heavily doped layer 80 may be formed in substrate 40 below upper surface 41 using for example epitaxial deposition techniques to deposit layers of semiconductor material of the desired conductivity. Or, electrodes 47 through 50 may be located below upper surface 41 in substrate 40 and electrode 80 may be located in substrate 40 adjacent electrodes 47 through 50 or be positioned above or below electrodes 47 through 50 including being positioned on upper surface 41 above and between electrodes 47 through 50 provided provision is made for coupling an electronic bias to electrodes 47 through 50. The function of heavily doped layer 80 is to absorb incident radiation so that it will not be reflected by upper surface 41 back through substrate 40.

Figure 6:
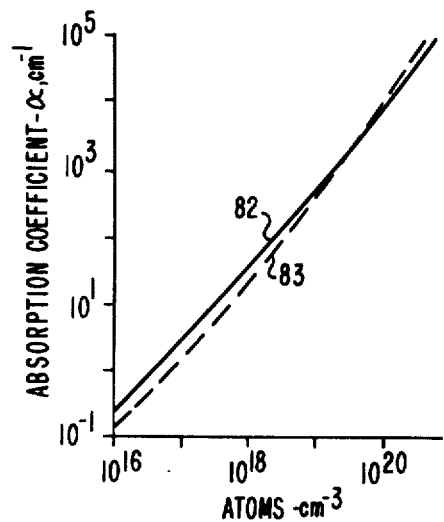
FIG. 6 shows a curve of the free carrier absorption coefficient $\alpha$ versus the doping level in silicon.

FIG. 6 shows a curve of the free carrier absorption coefficient $\alpha$ versus the doping level in silicon. In FIG. 6, the ordinate represents $\alpha cm^{-1}$ and the abscissa represents doping level in atoms $cm^{-3}$. In FIG. 6, the absorption coefficient for free carrier absorption in silicon was measured at a wavelength of 5 micrometers. In FIG. 6, curve 82 is for the case where the doping atoms are P type and curve 83 is for the case where the doping atoms are N type. As shown in FIG. 6, a doping level of $10^{20}$ atoms/$cm^{-3}$ can provide an absorption coefficient $\alpha$ as high as $10^4$ $cm^{-1}$. Free carrier absorption in semiconductors occurs when the photon energy traveling in the semiconductor is absorbed by free carriers in either the conduction or valence band. The free carrier absorption coefficient $\alpha$ in semiconductors is given, in MKS units, by equation (1):

$$\alpha = \frac{q^3 \lambda^2 p}{4\pi^2 \epsilon_0 C^3 n m^{*2}} \quad (1)$$

where $\lambda$ equals wavelength, P equals density of free carriers (either electrons or holes), n equals refractive index, $m^*$ equals effective mass, and $\mu$ equals mobility. By substituting some reasonable values for the conductivity effective mass $m^*$ and $\mu$, $m_n^*/m$ equals 0.28 and $m_p^*/m$ equals 0.37, $\mu_n$ approximately equals 100 $cm^2/V.s$ and $\mu_P$ proportionally equals 50 $cm^2/V.s$ then the absorption coefficient $\alpha_n$ is proportionally equal to $$\alpha_n \approx 2 \times 10^{-18} \lambda^2 n \quad (2)$$

and the absorption coefficient $\alpha_P$ is proportionally equal to $$\alpha_P \approx 1.5 \times 10^{-18} \lambda^2 p \quad (3)$$

Figure 7:
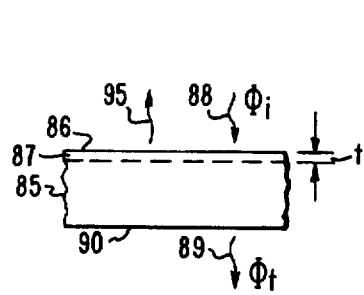
FIG. 7 shows a cross section of a crystalline substrate with a doped or diffused layer of impurities.

FIG. 7 shows a cross-section of a crystalline substrate with a diffused layer of impurities. In FIG. 7, silicon substrate 85 is of P type material having a P type concentration of 2,000 ohms/cm. Silicon substrate 85 has an upper surface 86 through which a P+ diffused layer 87 was formed. Diffused layer 87 has a thickness t. Radiant energy 88 incident upper surface 86 is represented by $\Phi_i$. Radiant energy 89 $\Phi_t$ exits crystalline substrate 85 through lower surface 90 and represents that portion of radiant energy 88 $\Phi_j$ which passes completely through diffused layer 87 and crystalline substrate 85. The radiant energy reflected at upper surface 86 before entering substrate 85 is shown by arrow 95.

Figure 8:
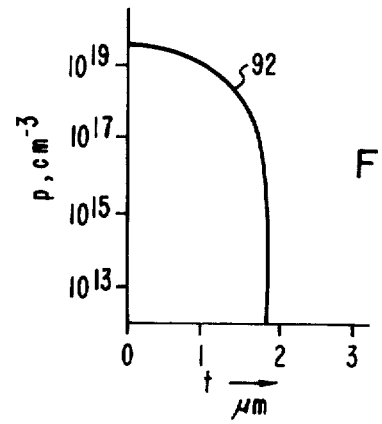
FIG. 8 shows the typical doping concentration in the diffused layer of FIG. 5 as a function of depth.

FIG. 8 shows a typical doping concentration of the doped layer 80 of FIG. 5 and layer 87 of FIG. 7 as a function of depth t. In FIG. 8, the ordinate represents the dopant concentration in atoms $cm^{-3}$ and the abscissa represents the depth t from upper surface 86 of silicon substrate 85 as shown in FIG. 7. Layer 87 may be formed by gaseous diffusion, solid impurity diffusion, epitaxial, deposition, or ion implantation to form a variety of diffusion impurity profiles. As shown in FIG. 6, the heavier the doped layer or the greater the concentration of impurities, the greater will be the absorption coefficient $\alpha$. Since $\alpha$ is proportional to the wavelength$^2$, $\alpha$ may be a dominant term for the passing of infrared radiation while insignificant for the passage of visible radiation.

Figure 9:
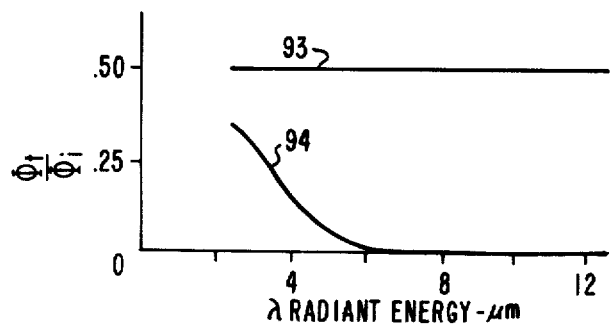
FIG. 9 shows curves of the transmissivity of a crystalline substrate with and without a doped layer as a function of the wavelength of radiant energy.

FIG. 9 shows a curve of the transmissivity of a crystalline substrate 85 with and without a doped layer as a function of radiant energy wavelength. In FIG. 9, the ordinate represents the ratio of the radiant energy 89 to radiant energy 88 or $\Phi_t/\Phi_i$. The abscissa represents the wavelength of the radiant energy 88 and 89 in micrometers. Curve 93 is for a crystalline substrate 85 without a layer 87. The 50% transmission value $\Phi_t/\Phi_i$ of a crystalline substrate without a doped layer is the result of the reflection of radiant energy 88 as shown by radiant energy 95 at the air and upper surface of the silicon substrate 85 interface.

The transmissivity $\Phi_t/\Phi_i$ of silicon substrate 85 having a doped layer 87 with a concentration profile as shown in FIG. 8 is shown by curve 94 in FIG. 9. The impurity concentration profile shown by curve 92 in FIG. 8 has not been optimized for maximum free carrier absorption. However, very high absorption for low transmissivity is shown by curve 94 in FIG. 9. Doped layer 87 may be optimized through a choice of the correct doping concentration and thickness to achieve complete absorption to prevent any reflection of the type shown in FIG. 1 where a reflecting surface is located below the doped layer. Reference is made to a publication by D. K. Schroder, R. N. Thomas, and J. C. Swartz entitled "Free Carrier Absorption In Silicon", IEEE Transactions on Electron Devices, Volume DD25, No. 2, February, 1978, which provides additional experimental data with regard to the concentration profiles of doped layers and the transmissivity of radiant energy through the doped layers which is incorporated herein by reference.

A sensor for converting radiant energy into electrical signals and for suppressing optical crosstalk is described utilizing a crystalline substrate having a first surface suitable for receiving radiant energy, the substrate including a plurality of detectors for generating electronic charge in response to the passing of radiant energy through the first surface, and means for absorbing a portion of the radiant energy passing through the first surface and propagating beyond a predetermined distance in the crystalline substrate below the first surface.

What is claimed is:

1. A sensor for converting radiant energy having a wavelength greater than 3 micrometers into electrical signals and for suppressing optical crosstalk comprising:
   a crystalline substrate having a semiconductor first surface suitable for receiving radiant energy;
   said substrate including a plurality of detectors for generating electronic charge in response to the passing of radiant energy through said first surface; and
   means for absorbing a portion of said radiant energy passing through said first surface and propagating beyond a predetermined distance in said crystalline substrate below said first surface;
   said means for absorbing including a heavily doped layer of impurities to provide substantial optical absorption in said layer by the mechanism of free carrier absorption.

2. The sensor of claim 1 wherein said doped layer is formed by diffusion.

3. The sensor of claim 1 wherein said doped layer is formed by epitaxial deposition.

4. The sensor of claim 1 wherein said doped layer is formed by ion implantation.

5. The sensor of claim 1 wherein said doped layer has an impurity concentration in portions thereof of at least $10^{17}$ atoms/centimeter$^3$.

6. The sensor of claim 1 wherein said crystalline substrate is silicon.

7. The sensor of claim 1 wherein said crystalline substrate is doped to form P-type material and said doped layer of impurities is doped to form P+ type material.

8. The sensor of claim 8 wherein said substrate is doped with indium and said doped layer is doped with Boron.

9. The sensor of claim 1 wherein said crystalline substrate is doped to form N-type material and said doped layer of impurities is doped to form N+ type material.

10. The sensor of claim 9 wherein said substrate is doped with sulfur and said doped layer is doped with phosphorous.

11. The sensor of claim 1 wherein said means for absorbing is positioned at one end of said plurality of detectors.

12. The sensor of claim 1 wherein said means for absorbing is positioned beyond said plurality of detectors.

13. The sensor of claim 1 wherein said crystalline substrate has a second surface spaced below said first surface and said means for absorbing functions to prevent reflection of radiant energy from said second surface back through adjacent detectors.

14. The sensor of claim 1 wherein said substrate includes impurities of a first type to generate charge in response to the absorption of radiant energy, and further including:
   a plurality of first electrodes formed in said first surface;
   a second electrode formed in said second surface below said plurality of first electrodes;
   means for applying a voltage across each said plurality of first electrodes and said second electrode; and
   means for coupling a signal from each of said first electrodes.

15. The sensor of claim 15 wherein said impurities of a first type are N-type;
   said first electrodes are N+ type regions; and
   said second electrode is an N+ type region.

16. The sensor of claim 15 wherein said impurities of a first type are P-type;
   said first electrodes are P+ type regions; and
   said second electrode is a P+ type region.

* * * * *